United States Patent
Buttolo et al.

(10) Patent No.: US 6,889,176 B1
(45) Date of Patent: May 3, 2005

(54) METHOD FOR RECONSTRUCTING THE TOPOLOGY OF A POLYGONAL SOUP

(75) Inventors: Pietro Buttolo, Dearborn, MI (US); Paul Joseph Stewart, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 765 days.

(21) Appl. No.: 09/624,106

(22) Filed: Jul. 24, 2000

(51) Int. Cl.[7] .............................................. G06F 17/50
(52) U.S. Cl. ...................... 703/1; 703/2; 703/7; 703/8; 345/420; 345/423; 345/441
(58) Field of Search ................................ 703/1–2, 7–8; 345/419–427, 441

(56) References Cited

U.S. PATENT DOCUMENTS

| | | | | |
|---|---|---|---|---|
| 5,946,479 A | * | 8/1999 | Sakaguchi et al. | 716/20 |
| 6,563,499 B1 | * | 5/2003 | Waupotitsch et al. | 345/420 |
| 6,606,584 B1 | * | 8/2003 | Junkins | 703/1 |

OTHER PUBLICATIONS

Gran, "Octree–based Simplification of Polyhedral Solids," Doctoral Thesis, Computer Science Department, Universitat Politècnica de Catalunya, pp. 1–128 (Jun. 1999), paper available at: http://citeseer.nj.nec.com/348763.html.*

Kalvin et al, "Superfaces: Polygonal Simplification with Bounded Error," IEEE Computer Graphics and Applications, pp. 64–77 (May 1996).*

Arata, "Simplification of Triangle Meshes for Fast Surface Rendering of Tomographic Data," IEEE Nuclear Science Symposium and Medical Imaging Conference, vol. 3 pp. 1438–1442 (Oct. 1994).*

Schroeder et al, "Decimation of Triangle Meshes," Proceedings of the 19th Annual Conference on Computer Graphics and Interactive Techniques, vol. 26 No. 2, pp. 65–70 (Jul. 1992).*

* cited by examiner

Primary Examiner—Samuel Broda
(74) Attorney, Agent, or Firm—Damian Porcari

(57) ABSTRACT

A method for automatically reconstructing topographical information for a given mesh, altering the mesh by introducing, deleting, or splitting existing polygons when needed. An OctTree space decomposition is used to achieve a log2-complexity search method to find the closest vertex in the polygonal soup to a given point in space. Linear complexities are used to find triangles connected to a given vertex and all triangles connected to a given triangle. The triangles are split to enforce conductivity.

11 Claims, 5 Drawing Sheets

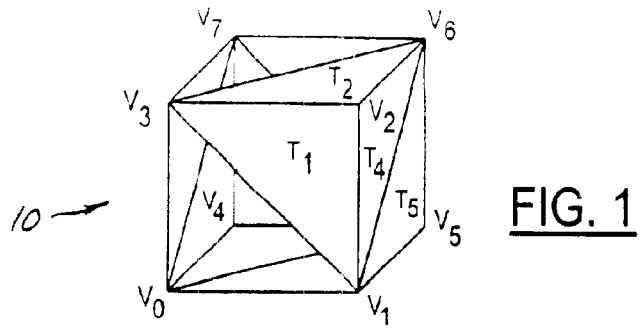

FIG. 1

| Triangle | $V_{i1}$ | $V_{i2}$ | $V_{i3}$ |
|---|---|---|---|
| $T_0$ | $V_0$ | $V_1$ | $V_3$ |
| $T_1$ | $V_2$ | $V_3$ | $V_1$ |
| $T_2$ | $V_2$ | $V_6$ | $V_3$ |
| $T_3$ | $V_7$ | $V_3$ | $V_6$ |
| $T_4$ | $V_2$ | $V_1$ | $V_6$ |
| $T_5$ | $V_5$ | $V_6$ | $V_1$ |
| $T_6$ | $V_4$ | $V_7$ | $V_5$ |
| $T_7$ | $V_6$ | $V_5$ | $V_7$ |
| $T_8$ | $V_1$ | $V_0$ | $V_5$ |
| $T_9$ | $V_4$ | $V_5$ | $V_0$ |
| $T_{10}$ | $V_3$ | $V_7$ | $V_0$ |
| $T_{11}$ | $V_4$ | $V_0$ | $V_7$ |

| Vertex | X | Y | Z |
|---|---|---|---|
| $V_0$ | -1 | -1 | +1 |
| $V_1$ | +1 | -1 | +1 |
| $V_2$ | +1 | +1 | +1 |
| $V_3$ | -1 | +1 | +1 |
| $V_4$ | -1 | -1 | -1 |
| $V_5$ | +1 | -1 | -1 |
| $V_6$ | +1 | +1 | -1 |
| $V_7$ | -1 | +1 | -1 |

```
solid CUBE
  facet
    outer loop
      vertex -1 -1 +1
      vertex +1 -1 +1
      vertex -1 +1 +1
    endloop
  endfacet
  facet
    outerloop
      vertex +1 +1 +1
      vertex -1 +1 +1
      vertex +1 -1 +1
    endloop
  endfacet
  facet
    outer loop
      vertex +1 +1 +1
      vertex +1 +1 -1
      vertex -1 +1 +1
    endloop
  endfacet
  .....
  .....
endsolid CUBE
```

FIG. 2

| Vertex | $T_{i1}$ | $T_{i2}$ | | Vertex | $T_{i1}$ | $T_{i2}$ | | Vertex | $T_{i1}$ | $T_{i2}$ | ... | | |
|---|---|---|---|---|---|---|---|---|---|---|---|---|---|
| $V_0$ | $T_0$ | | | $V_0$ | $T_0$ | | | $V_0$ | $T_0$ | $T_8$ | $T_9$ | $T_{10}$ | $T_{11}$ |
| $V_1$ | $T_0$ | | | $V_1$ | $T_0$ | $T_1$ | | $V_1$ | $T_0$ | $T_1$ | $T_4$ | $T_5$ | $T_8$ |
| $V_2$ | | | | $V_2$ | $T_1$ | | | $V_2$ | $T_1$ | $T_2$ | $T_4$ | | |
| $V_3$ | $T_0$ | | | $V_3$ | $T_0$ | $T_1$ | | $V_3$ | $T_0$ | $T_1$ | $T_2$ | $T_3$ | $T_{10}$ |
| $V_4$ | | | | $V_4$ | | | | $V_4$ | $T_6$ | $T_9$ | $T_{11}$ | | |
| $V_5$ | | | | $V_5$ | | | | $V_5$ | $T_5$ | $T_6$ | $T_7$ | $T_8$ | $T_9$ |
| $V_6$ | | | | $V_6$ | | | | $V_6$ | $T_2$ | $T_3$ | $T_4$ | $T_5$ | $T_7$ |
| $V_7$ | | | | $V_7$ | | | | $V_7$ | $T_3$ | $T_6$ | $T_7$ | $T_{10}$ | $T_{11}$ |
| A | | | | B | | | | C | | | | | |

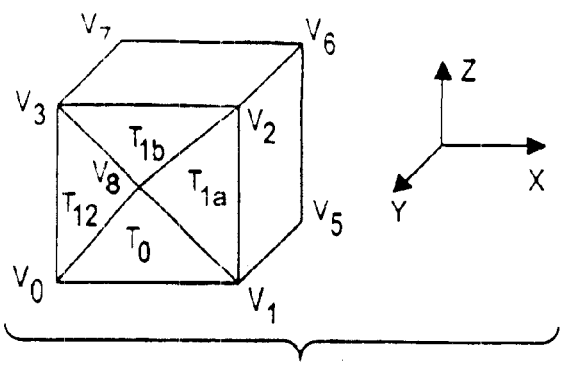
FIG. 9
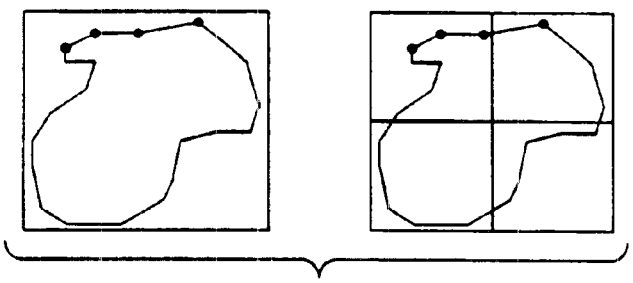
FIG. 10
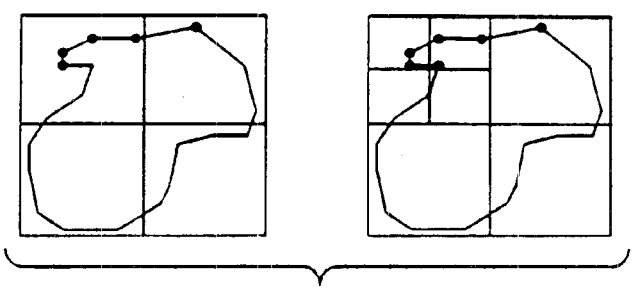
FIG. 11
FIG. 12

METHOD FOR RECONSTRUCTING THE TOPOLOGY OF A POLYGONAL SOUP

TECHNICAL FIELD

The present invention relates to visualization tools for interactive simulations with complex vehicle models.

BACKGROUND OF THE INVENTION

To meet the need for interactive simulations with complex vehicle models, a generation of visualization tools have been developed. However, most of these tools have limitations inherent in their data structure. In this regard, most visualization tools have adopted a polygonal soup, that is, an unstructured collection of polygons, as their standard data representation. However, a variety of existing applications, such as CFD (Computational Fluid Dynamics), FEA (Finite Element Analysis), and assembly simulation, require more than a cloud of points or triangles.

Thus, a need exists for a method of reconstructing the topographical information (relationships between polygons) of a polygonal soup in order to overcome the known problems with visualization tools.

SUMMARY OF THE INVENTION

The object of the present invention is to provide an improved visualization tool for interactive simulation with complex vehicle models. It is another object of the present invention to provide a visualization tool that comprises more than a cloud of points or triangles.

In accordance with the present invention, an algorithm is provided which automatically reconstructs topological information for a given mesh and then alters the mesh by introducing, deleting, or splitting existing polygons when needed.

In accordance with the present invention, a new OctTree space decomposition is used to achieve a log2-complexity search which locates the closest vertex in the polygonal soup to a given point in space. A technique with linear complexity is then used to locate all of the triangles connected to that vertex. A technique with linear complexity is also used to find all triangles connected to a given triangle. The triangles are then split to enforce conductivity.

These and other objects, features, and advantages of the present invention will become apparent from the following detailed description of the invention when viewed in accordance with the accompanying drawings and appended claims.

BRIEF DESCRIPTION OF THE DRAWINGS

FIG. 1 depicts an exemplary cube representation for modeling tessellated meshes;

FIG. 2 sets forth index representations of the triangles and vertices of the cube depicted in FIG. 1;

FIG. 9 illustrates the exemplary cube as modified;

FIG. 10 illustrates another step in the sorting process;

FIG. 11 illustrates another step in the sorting process;

FIG. 12 depicts another sorting example;

DESCRIPTION OF THE PREFERRED EMBODIMENT(S)

Figures 3, 4:
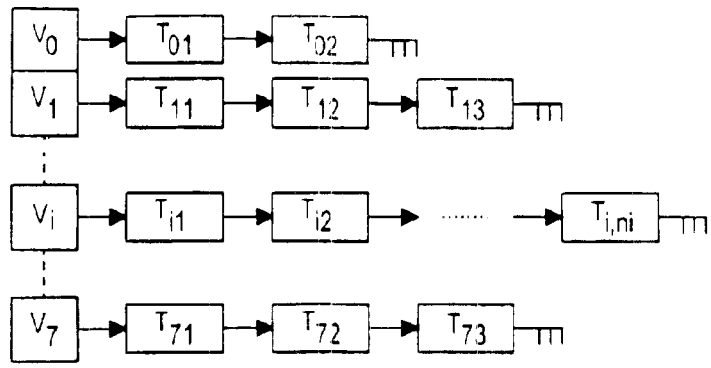
FIG. 3 depicts a dynamic vector vertex-neighbor table.
FIG. 4 depicts tables generated from the vertex-neighbor table.

As indicated, there is a need for interactive simulation with complex systems, such as airplanes and cars, and in fact visualization tools have been developed which are capable of rendering large models in real-time. However, in developing the 3-D rendering tools, insufficient attention has been paid to architecting systems capable of evolving into effective modeling tools. One of the critical limitations is inherent in the data structure. Almost all visualization tools have adopted polygonal soups as their standard data representation. However, a variety of existing applications, ranging from CFD, FEA and assembling simulations, require more than a cloud of points or triangles.

Currently, different data representations are used to model tessellated meshes. FIG. 1 illustrates one example represented by a cube 10. The cube is modeled as a set of eight triangles, two per side, and eight vertices, $V_0$ through $V_7$.

In the STL (stereo lithography) format, the model is described in either ASCII or binary format, as a list of triangular elements. The actual coordinates of the three vertices of each of the triangles are expressly stored and are shown in the lefthand table set forth in FIG. 2. The actual coordinates of the three vertices are provided on the left side of the table in FIG. 2, and the cube is represented as a list of 3×12 vertices. In this regard, other representations, such as Virtual Reality Modeling Language (VRML), OpenGL, Optimizer, DirectX, and DirectModel, offer other efficient, indexed representations.

FIG. 2 shows two separate lists, a vertex list with the coordinates of all vertices, and a triangle list where the indexes of the vertices for each triangle, relative to the vertex list, are stored.

The STL representation is, in fact, a true polygonal soup, that is, the geometry is a set of unconnected triangles. The index representation is better. In this regard, the same vertex is shared among multiple triangles and provides some topological information. However, the facets are usually connected in strips or fans for graphics performance, without a collective topological map and with multiple representations of the same vertex on different strips. This causes small gaps in the geometry to appear because of numerical approximations.

Real-time tools, such as collision detection tracking algorithms, take advantage of spatial coherency between successive time samples. This requires information about vertex and edge connectivity, such as the neighbors of a given triangle and of a given vertex. For example, in the case of the cube shown in FIG. 1, the triangle $T_4$ is connected to triangles $T_1$, $T_2$ and $T_5$, and the vertex $V_2$ is shared among the triangles $T_1$, $T_2$, and $T_4$.

The present inventive method basically consists of three steps or phases. In the first phase, the vertex and edge conductivity information is developed starting from available information. The second and third phases deal with imperfect meshes. During the second phase, vertex duplicates are discovered and eliminated. During the third phase, the model is re-meshed to realign strips of triangles that do not share common vertices.

The initial phase is divided into three additional steps. In the first step, the index representation of FIG. 2 is generated. An initial attempt of reducing duplicated vertices is performed at this stage. In this regard, the first step operation is only required when the geometry is described as an explicit set of triangles, such as STL. In the second and third steps, the vertex-neighbors, and edge-neighbor tables are developed.

The vertex-neighbors table is a dynamic vector where, for each vertex, the list of all the connected triangles is immediately available, as is shown in FIG. 3. The algorithm sequentially browses the triangle list. For each triangle, the table listed in FIG. 2 contains the indexes of the three vertices. An identifier, pointing to the triangle sequential number in the triangle-list is added to the index-neighbor list, in correspondence to each vertex. For example, in the case of the cube shown in FIG. 1, this method would start by looking at the triangle $T_0$ with vertices $V_0$, $V_1$, and $V_3$. Table A in FIG. 4 is then generated.

Proceeding with $T_1$, the additional entries are added to Table B. Thereafter, the complete vertex-neighbor Table C is developed. Since the triangle-index table is traversed only one time, this creates an efficient, linear-complexity algorithm. In this regard, the number of computations is $n_t \times 3$, where $n_t$ is the number of triangles.

Figure 5:
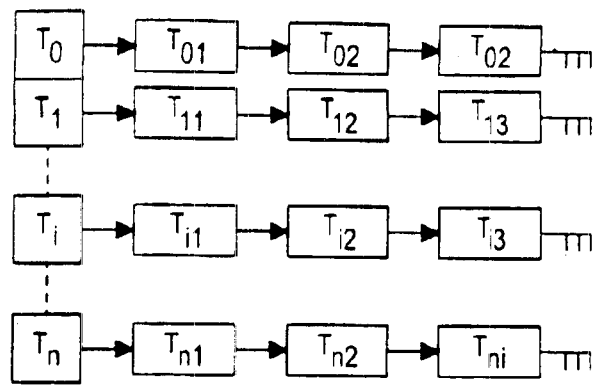
FIG. 5 depicts a dynamic vector edge-neighbor table.

The edge-neighbors table is a vector of lists with an entry for each triangle. Each list has three elements, one for each edge of the given triangle, $V_{11}$–$V_{12}$, $V_{12}$–$V_{13}$, and $V_{13}$–$V_{10}$, respectively, depending on the position of the element in the list. These elements can be equal to either –1, to represent an unconnected edge, or to the sequential number of the connected triangle to the selected edge, as can be seen in FIG. 5. Thereafter, the algorithm sequentially browses the triangle list, starting with the first element, and determines if there are other triangles that share any of its three edges. For example, with the cube illustrated in FIG. 1, the first edge $V_0V_1$ of the first triangle $T_0$ can be viewed as follows:

| Triangle | $V_{i1}$ | $V_{i2}$ | $V_{i3}$ |   |
|---|---|---|---|---|
| $T_0$ | $V_0$ | $V_1$ | $V_3$ | (1) |
| ... | ... | ... | ... |   |

Two triangles are connected at an edge if they share the same two vertices making up the edge extremes, in this case $V_0$ and $V_1$. Then, a list of potential candidates is found looking for all triangles connected to $V_0$ that are not $T_0$ in the vertex-neighbors table. This is shown as follows:

| Vertex | $T_{i1}$ | $T_{i2}$ | ... | ... | ... |   |
|---|---|---|---|---|---|---|
| $V_0$ | $T_0$ | $T_8$ | $T_9$ | $T_{10}$ | $T_{11}$ | (2) |
| ... |   | ... |   | ... |   |   |

Since there are now four triangles, $T_8$–$T_{11}$, it is necessary to look at the triangle table to see if any of the candidates contains the vertex $V_1$ as well:

| Triangle | $V_{i1}$ | $V_{i2}$ | $V_{i3}$ |   |
|---|---|---|---|---|
| $T_8$ | $V_1$ | $V_0$ | $V_5$ | (3) |
| $T_9$ | $V_4$ | $V_5$ | $V_0$ |   |
| $T_{10}$ | $V_3$ | $V_7$ | $V_0$ |   |
| $T_{11}$ | $V_4$ | $V_0$ | $V_7$ |   |

In this particular example, the first edges of $T_0$ and the first edge of $T_8$ share the same vertices $V_1$ and $V_0$. The two triangles are connected, and the edge-neighbor table is then updated as shown below:

| Triangle | $T_{i1}$ | $T_{i2}$ | $T_{i3}$ |   |
|---|---|---|---|---|
| $T_0$ | $V_8$ |   |   | (4) |
| ... | ... | ... | ... |   |
| $T_8$ | $T_0$ |   |   |   |
| ... | ... | ... | ... |   |

As a result, after browsing all of the edges of all of the triangles, the following table is completed:

| Triangle | $T_{i1}$ | $T_{i2}$ | $T_{i3}$ |   |
|---|---|---|---|---|
| $T_0$ | $T_8$ | $T_1$ | $T_{10}$ | (5) |
| $T_1$ | $T_2$ | $T_0$ | $T_4$ |   |
| $T_2$ | $T_4$ | $T_3$ | $T_1$ |   |
| $T_3$ | $T_{10}$ | $T_2$ | $T_7$ |   |
| $T_4$ | $T_1$ | $T_5$ | $T_2$ |   |
| $T_5$ | $T_7$ | $T_4$ | $T_8$ |   |
| $T_6$ | $T_{11}$ | $T_7$ | $T_9$ |   |
| $T_7$ | $T_5$ | $T_6$ | $T_3$ |   |
| $T_8$ | $T_0$ | $T_9$ | $T_5$ |   |
| $T_9$ | $T_6$ | $T_8$ | $T_{11}$ |   |
| $T_{10}$ | $T_3$ | $T_{11}$ | $T_0$ |   |
| $T_{11}$ | $T_9$ | $T_{10}$ | $T_6$ |   |

As shown in Table (5), it is noted that there are not any unconnected edges and, therefore, this particular geometry is a manifold body.

The total number of computations depends on the average number of triangles connected to a given vertex. The triangle/vertex ratio $n_{t/v}$ ranges from a value of three in the case of a tetrahedron, to 4.5 for the cube described above, to about 5.0 for typical automotive models. This means that the number of computations to find the triangle connected to a given edge is:

$$(n_{t/v}-1) \cdot 3 \tag{6}$$

Since each triangle has three edges, and there are $n_c$ triangles, then the total number of computations is:

$$n_t \cdot (n_{t/v}-1) \cdot 9 \approx n_t \cdot 36 \tag{7}$$

This provides an efficient, linear-complexity algorithm.

The algorithms used to reconstruct the topographical information of a tessellated mesh, as discussed above, rely on two assumptions. The first assumption is that duplicate vertices have the same coordinates. This requirement is a foundation of a variety of search engines, usually based on balanced trees or skip-lists, used to detect duplicate vertices.

Figure 6:
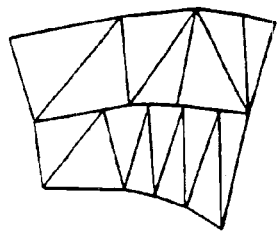
FIG. 6 illustrates an object compound of unconnected strips of connected triangles.

The second assumption is that the tessellation is built without gaps. This translates in having strips or fans of triangles all topologically connected at the same set of vertices. However, in particular with VRML and OpenGL files, the objects are composed of unconnected strips of connected triangles, as shown in FIG. 6. This prevents building of edge connectivity since two triangles are considered connected at an edge only if they share the entire edge.

As a result, existing visualization tools for complex systems have a plurality of gaps, poor alignment, and degenerate meshes. Also, duplicate vertices and the synchronization of triangle strips are not sufficiently taken into account.

In the present invention, these problems with existing systems are considered and taken into account. Duplicate vertices are eliminated and triangle strips are synchronized. The algorithm for accomplishing this is described below.

If the vertex $V_0$ is duplicated and the copies replaced by the vertex $V_{cb}$ in the cube model described above to describe the triangles $T_{10}$ and $T_{11}$, the new vertex and triangle list are then modified as follows:

| Vertex | X | Y | Z | |
|---|---|---|---|---|
| $V_0$ | −1 | −1 | +1 | (8) |
| $V_{0b}$ | −1 | −1 | +1 | |
| ... | ... | ... | ... | |

| Triangle | $V_{i1}$ | $V_{i2}$ | $V_{i3}$ |
|---|---|---|---|
| ... | ... | ... | ... |
| $T_{10}$ | $V_3$ | $V_7$ | $V_{0b}$ |
| $T_{11}$ | $V_4$ | $V_{0b}$ | $V_7$ |

Due to the new duplicate vertex, the vertex-neighbors and edge-neighbors tables are also changed to the following:

| Vertex | $T_{i1}$ | $T_{i2}$ | ... | ... | ... | |
|---|---|---|---|---|---|---|
| $V_0$ | $T_0$ | $T_8$ | $T_9$ | | | (9) |
| $V_{0b}$ | $T_{10}$ | $T_{11}$ | | | | |
| ... | ... | ... | ... | ... | ... | |

| Triangle | $T_{i1}$ | $T_{i2}$ | $T_{i3}$ |
|---|---|---|---|
| $T_0$ | $T_8$ | $T_1$ | −1 |
| ... | ... | ... | ... |
| $T_9$ | $T_6$ | $T_8$ | −1 |
| $T_{10}$ | $T_3$ | $T_{11}$ | −1 |
| $T_{11}$ | −1 | $T_{10}$ | $T_6$ |

As a result, all four triangles, $T_0$, $T_9$, $T_{10}$, and $T_{11}$, now each have an unconnected edge.

In order to remove duplicate vertices, the algorithm first browses the edge table searching for unconnected edges. Once an edge is found, duplicate copies of either one of the two vertices at the ends of the segment are looked for, by searching in the vertex list for the closest vertex. In Table 8 above, vertices $V_0$ and $V_{0b}$ have the same coordinates, and therefore have minimum distance, equal to zero. However, in other cases, the distance is small, but significant. It is necessary to make sure that the mesh will not degenerate once a vertex is replaced with another one.

Once a duplicate vertex has been found, the procedure is as follows: (a) in the triangle index table, all references to the duplicate vertices are replaced with a reference to the original vertex; (b) the entry in the vertex table for the duplicate vertex is removed and the appropriate connected triangles are added to the entry list of the original vertex; and; and (c) the edge table for all triangles connected to "original" vertices are rebuilt. When applied to the copy of duplicated vertices, $V_0$ and $V_{0b}$, this sequence restores the original vertex, triangle, vertex-neighbors and edge-neighbors tables.

Figure 7:
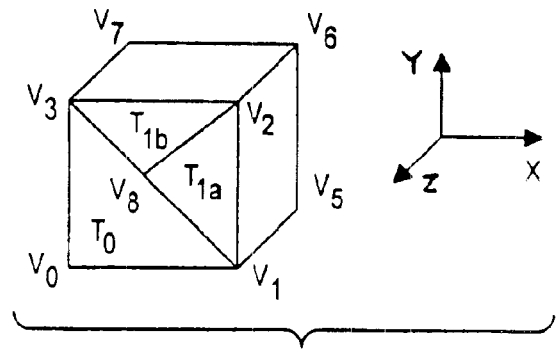
FIG. 7 depicts a generalized example of a step in synchronizing triangle strips.

The problem with synchronizing triangle strips, such as those depicted in FIG. 6, can be generalized as shown in FIG. 7 as a vertex falling inside another triangle edge. The introduction of two new triangles, namely $T_{1a}$ and $T_{1b}$ as well as a new vertex $V_8$, changes the vertex and triangle table as follows:

| Vertex | X | Y | Z | |
|---|---|---|---|---|
| ... | ... | ... | ... | (10) |
| $V_8$ | 0 | 0 | +1 | |

| Triangle | $V_{i1}$ | $V_{i2}$ | $V_{i3}$ |
|---|---|---|---|
| ... | ... | ... | ... |
| $T_{1a}$ | $V_2$ | $V_8$ | $V_1$ |
| $T_{1b}$ | $V_2$ | $V_3$ | $V_8$ |
| ... | ... | ... | ... |

As evident from the new edge-neighbor table, there are three edges that are not connected:

| Triangle | $T_{i1}$ | $T_{i2}$ | $T_{i3}$ | |
|---|---|---|---|---|
| $T_0$ | $T_8$ | −1 | $T_{10}$ | (11) |
| $T_{1a}$ | $T_{1b}$ | −1 | $T_4$ | |
| $T_{1b}$ | $T_2$ | −1 | $T_{1a}$ | |
| ... | ... | ... | ... | |

There are different alternatives for building a topological connection. First, an artificial vertex could be introduced in the triangle $T_0$. However, this would require dealing with polygons having different numbers of sides since with a new vertex, $T_0$, would be a quadrilateral. Secondly, the vertex $V_8$ could be moved to overlap either one of the two vertices $V_1$ or $V_3$, and then be eliminated. However, this approach would only modify the geometry, with the potential loss of important details, if the triangles connected to $V_8$ do not share the same normal. Thirdly, the triangle $T_0$ could be split into two new triangles, replacing the edge $V_1V_3$ with $V_1V_8$, and $V_3V_8$, respectively.

The present invention implements the latter alternative. As in the method dealing with duplicated edges, the algorithm browses the edge table looking for unconnected edges. Once an edge is found, it then looks for any vertex that falls very close to the edge itself, but not on one of its vertices. In the example shown in FIG. 7, the first unconnected edge that is

| Triangle | $V_{i1}$ | $V_{i2}$ | $V_{i3}$ | |
|---|---|---|---|---|
| $T_0$ | $V_0$ | $V_1$ ... | $V_3$ | (12) |
| ... | ... | ... | ... | |

| Triangle | $T_{i1}$ | $T_{i2}$ | $T_{i3}$ |
|---|---|---|---|
| $T_0$ | $T_8$ | −1 | $T_{10}$ |
| $T_{1a}$ | $T_{1b}$ | −1 | $T_4$ |
| $T_{1b}$ | $T_2$ | −1 | $T_{10}$ |
| ... | ... | ... | ... | encountered is the second edge $V_1V_3$ of the triangle $T_0$: Searching in the vertex list, the closest vertex to this segment is $V_8$. Since the distance to the segment is equal to zero, and the distance to both segment extremes is equal to $\sqrt{2}$, the vertex is recognized to fall on an inside edge. Once the closest vertex is found, it is necessary to search in the vertex-neighbors table to see if there is a triangle connected to it which has an unconnected edge parallel to the original edge. Moreover, the triangle must not overlap the original triangle. In the "cube" example discussed above, there are two triangles connected to $V_8$:

| Vertex | $T_{i1}$ | $T_{i2}$ | ... | ... | ... |
|---|---|---|---|---|---|
| ... | ... | | | | |
| $V_8$ | $T_{1a}$ | $T_{1b}$ | | | (13) |

Once a triangle, edge, and vertex have been identified, the geometry is then re-meshed by splitting the triangle. First, the triangle table is updated to reflect the fact that the original triangle is split into two new elements. In general, the original triangle is kept with one of its vertex indexes replaced and a new triangle is added. The triangle table will then change as follows:

| Triangle | $V_{i1}$ | $V_{i2}$ | $V_{i3}$ | |
|---|---|---|---|---|
| $T_0$ | $V_0$ | $V_1$ | $V_3$ | (14) |
| ... | ... | ... | ... | |

| Triangle | $V_{i1}$ | $V_{i2}$ | $V_{i3}$ |
|---|---|---|---|
| $T_0$ | $V_0$ | $V_1$ | $V_8$ |
| ... | ... | ... | ... |
| $T_{12}$ | $V_0$ | $V_8$ | $V_3$ |

Figure 8:
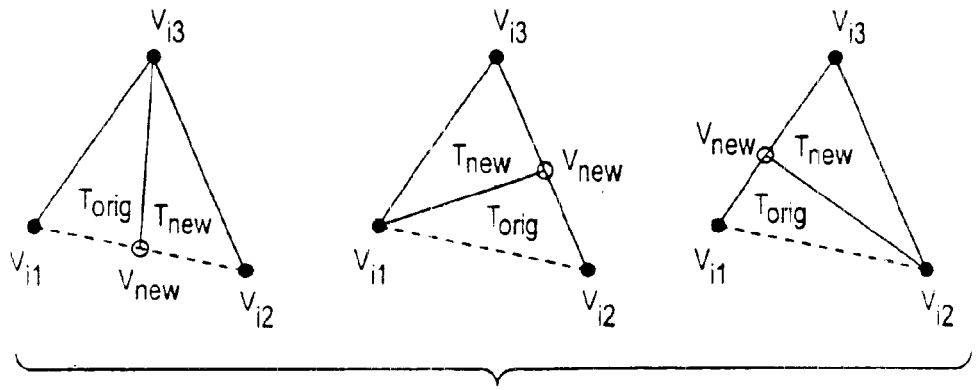
FIG. 8 depicts the formation of new triangles.

In the generic case, the algorithm must take into account which edge the unconnected vertex falls on, as shown in FIG. 8. The generic rules to update the triangle table are then summarized as follows:

| | | Before | | | After | | | (15) |
|---|---|---|---|---|---|---|---|---|
| | Triangle | $V_{i1}$ | $V_{i2}$ | $V_{i3}$ | $V_{i1}$ | $V_{i2}$ | $V_{i3}$ | |
| edge $V_{i1}$–$V_{i2}$ | $T_{orig}$ $T_{new}$ | $V_{i1}$ — | $V_{i2}$ — | $V_{i3}$ — | $V_{i1}$ $V_{new}$ | $V_{new}$ $V_{i2}$ | $V_{i3}$ $V_{i3}$ | |
| edge $V_{i2}$–$V_{i3}$ | $T_{orig}$ $T_{new}$ | $V_{i1}$ — | $V_{i2}$ — | $V_{i3}$ — | $V_{i1}$ $V_{i1}$ | $V_{i2}$ $V_{new}$ | $V_{new}$ $V_{i3}$ | |
| edge $V_{i3}$–$V_{i1}$ | $T_{orig}$ $T_{new}$ | $V_{i1}$ — | $V_{i2}$ — | $V_{i3}$ — | $V_{new}$ $V_{i1}$ | $V_{i2}$ $V_{i2}$ | $V_{i3}$ $V_{new}$ | |

Thereafter, the vertex-neighbor table is updated. In the case of the cube shown in FIG. 7, this would change as follows:

| Vertex | $T_{i1}$ | $T_{i2}$ | ... | ... | ... | |
|---|---|---|---|---|---|---|
| $V_0$ | $T_0$ | $T_8$ | $T_9$ | $T_{10}$ | $T_{11}$ | (16) |
| $V_1$ | $T_0$ | $T_{1a}$ | $T_4$ | $T_5$ | $T_8$ | |
| ... | ... | ... | ... | | | |
| $V_3$ | $T_0$ | $T_{1b}$ | $T_2$ | $T_3$ | $T_{10}$ | |
| ... | ... | ... | ... | | | |
| $V_8$ | $T_{1a}$ | $T_{1b}$ | | | | |

-continued

| Vertex | $T_{i1}$ | $T_{i2}$ | ... | ... | ... |
|---|---|---|---|---|---|
| $V_0$ | $T_0$ | $T_8$ | $T_9$ | $T_{10}$ | $T_{11}$ $T_{12}$ |
| $V_1$ | $T_0$ | $T_{1a}$ | $T_4$ | $T_5$ | $T_8$ |
| ... | ... | ... | ... | | |
| $V_3$ | $T_{1b}$ | $T_2$ | $T_3$ | $T_{10}$ | $T_{12}$ |
| ... | ... | ... | ... | | |
| $V_8$ | $T_{1a}$ | $T_{1b}$ | $T_0$ | $T_{12}$ | |

In the general case, the following table summarizes the rules needed for determining the new table, depending on which of the three angles is affected by the new vertex:

| | | Before | | | After | | | (17) |
|---|---|---|---|---|---|---|---|---|
| | Vertex | $T_{i1}$ | ... | ... | $T_{i1}$ | | | |
| edge $V_{i1}$–$V_{i2}$ | $V_{i1}$ $V_{i2}$ $V_{i3}$ $V_{new}$ | ... ... ... ... | $T_{orig}$ | ... | ... ... ... ... | $T_{new}$ $T_{new}$ $T_{orig}$ | $T_{new}$ | |
| edge $V_{i2}$–$V_{i3}$ | $V_{i1}$ $V_{i2}$ $V_{i3}$ $V_{new}$ | ... ... ... ... | $T_{orig}$ | ... | ... ... ... ... | $T_{new}$ $T_{new}$ $T_{orig}$ | $T_{new}$ | |
| edge $V_{i3}$–$V_{i1}$ | $V_{i1}$ $V_{i2}$ $V_{i3}$ $V_{new}$ | ... ... ... ... | $T_{orig}$ | ... | ... ... ... ... | $T_{new}$ $T_{new}$ $T_{orig}$ | $T_{new}$ | |

The last step is to update the edge-neighbors table in correspondence of the three vertices of the original triangle $V_{i1}$, $V_{i2}$ and $V_{i3}$ as well as the vertex projecting in the middle of the edge $V_{new}$, using the algorithm described above in equations (6) and (7). In the case of the present example, the edge-neighbors table is updated as follows:

| Triangle | $T_{i1}$ | $T_{i2}$ | $T_{i3}$ | |
|---|---|---|---|---|
| $T_0$ | $T_8$ | $T_{1a}$ | $T_{12}$ | (18) |
| $T_{1a}$ | $T_{1b}$ | $T_0$ | $T_4$ | |
| $T_{1b}$ | $T_2$ | $T_{12}$ | $T_{1a}$ | |
| ... | ... | ... | ... | |

The geometry is now manifold as shown in FIG. 9.

An efficient closest-vertex search is utilized in accordance with the present invention. If the entire geometry is searched, the number of calculations required to eliminate duplicate vertices and split triangles in order to obtain a connected, closed manifold is a function of the square of the number of vertices and shown by the following equation:

$$\frac{a}{2} \cdot n_e \cdot n_v = \frac{a}{2} \cdot \frac{n_e}{n_v} \cdot n_v^2 = \frac{a}{2} \cdot \frac{n_{e/v}}{2} \cdot n_v^2 = \frac{a}{2} \cdot \frac{3}{2} \frac{n_{t/v}}{2} \cdot n_v^2 \quad (19)$$

where $n_e$ is the number of edges, $n_v$ is the number of vertices, $$\frac{n_{e/v}}{2}$$

is the edge/vertex ratio, $$\frac{n_{t/v}}{2} = \frac{2}{3} \frac{n_{e/v}}{2}$$

is the triangle/vertex ratio, and a is the percentage of edges that are not connected and require some action. Since a typical tessellated model of a single vehicle component usually consists of hundreds of thousands of triangles, the number of computations quickly grows and becomes unmanageable when dealing with complex assemblies. Different solutions are available. Most of these are based on the same philosophy where all of the elements of the model are assigned to some bounding volumes of simple geometry. In order to reduce the number of computations from a linear to a logarithmic dimension, the hierarchy of bounding volumes is often used. Some implementations subdivide the space in spherical-containers, while others make use of variable-side bounding boxes.

With the present invention, the space is decomposed using an OctTree structure. This is a data-structure, similar to a voxel map, and is in current use in computer-graphics. An example illustrates its concept. If the parent mode of the OctTree is a box enclosing the entire workspace, vertices are assigned to it. As soon as there are more than a constant, assigned number of vertices in the parent node, for example 4, the box is split into a set of 8 identical smaller boxes, where the intersection is the empty set and the union is the original box. The elements previously assigned to the original box are then reassigned to the smaller containers. This is shown in FIG. 10. As the sorting continues and new vertices are assigned to the proper boxes, the sub-box that is filled is once more subdivided into eight smaller volumes and so on. This is shown in FIG. 11.

The data structure is bi-directional. Each node has a pointer linked to either a list of vertices or a list of sub-boxes. On the other hand, each vertex has embedded in its coordinate the address of the box containing it. Since the boxes are always split and each side is dissected into two equal segments, it is sufficient to find the address of the box to normalize the coordinates by the size of the workspace and then multiple the result by $2^n$, where n is the maximum number of layers, and round off to the nearest integer. For example, given the point shown in FIG. 12, the address in an n=4 layers OctTree is as follows:

$$\text{int}\left(\frac{x - x_{\min}}{x_{\max} - x_{\min}} \cdot 2^4\right), \text{int}\left(\frac{y - y_{\min}}{y_{\max} - y_{\min}} \cdot 2^4\right) \Rightarrow 0011,0001 \quad (20)$$

These indexes can be used to find the containing box. If the parent node points to a list of vertices, then the search is completed. Otherwise, the Most Significant Bits (MSB) defines the address of the sub-box which in this case is box 0,0. If this box had been subdivided, the child container is found by shifting the indexes to the left and using the MSBs once more. In the particular example shown above, the procedure ends after the indexes had been shifted three times. The sequence of boxes is then as follows: 00, 00, 10, 11.

Most vertices can be eliminated by looking only at those inside boxes whose intersections with the given shape is not null. To identify these boxes, one possibility is to find the smallest box in the OctTree index space enclosing the edge plus a neighborhood region function of epsilon. To do so, it is first necessary to map the edge equation from Cartesian to the OctTree index space. The edge is defined as the parameter α as:

$(x_0,y_0,z_0)+\alpha\cdot(\Delta x,\Delta y,\Delta z)$, with $\|\Delta x,\Delta y,\Delta z\|_2=1$ and $0 \leq \alpha \leq \alpha_{max}$ and it starts in $P_0=(x_0,y_0,z_0)$ and ends in $P_1=(x_0,y_0,z_0)+\alpha_{max}(\Delta x,\Delta y, \Delta z)$. (21)

Assuming all positive $\Delta x,\Delta y,\Delta z^4$, the maximum and minimum indexes of a box, aligned with the system axis and enclosing the edges are:

$$\bar{i}_{\min} = \left\{\text{int}\left(\frac{P_{0,x} - x_{\min}}{x_{\max} - x_{\min}} \cdot 2^n\right), \text{int}\left(\frac{P_{0,y} - y_{\min}}{y_{\max} - y_{\min}} \cdot 2^n\right), \text{int}\left(\frac{P_{0,z} - y_{\min}}{y_{\max} - y_{\min}} \cdot 2^n\right)\right\}, \quad (22)$$

$$\bar{i}_{\max} = \left\{\text{int}\left(\frac{P_{1,x} - x_{\min}}{x_{\max} - x_{\min}} \cdot 2^n\right), \text{int}\left(\frac{P_{1,y} - y_{\min}}{y_{\max} - y_{\min}} \cdot 2^n\right), \text{int}\left(\frac{P_{1,z} - y_{\min}}{y_{\max} - y_{\min}} \cdot 2^n\right)\right\}$$

Since the point must fall in an epsilon-neighborhood of the segment, the delta is calculated in the OctTree index space as follows:

$$\Delta i = \text{int}\left(\frac{\varepsilon}{x_{\max} - x_{\min}} \cdot 2^n + 0.5\right) \quad (23)$$

and then subtracted and added to the edge-enclosing box. The closest elements will be searched among all the vertices belonging to any of the sub-boxes satisfying the requisite equation:

$$\bar{i}_{min}-(\Delta i,\Delta i,\Delta i,) \leq \bar{i} \leq \bar{i}_{max}+(\Delta i,\Delta i,\Delta i) \quad (24)$$

Figures 13, 14, 15:
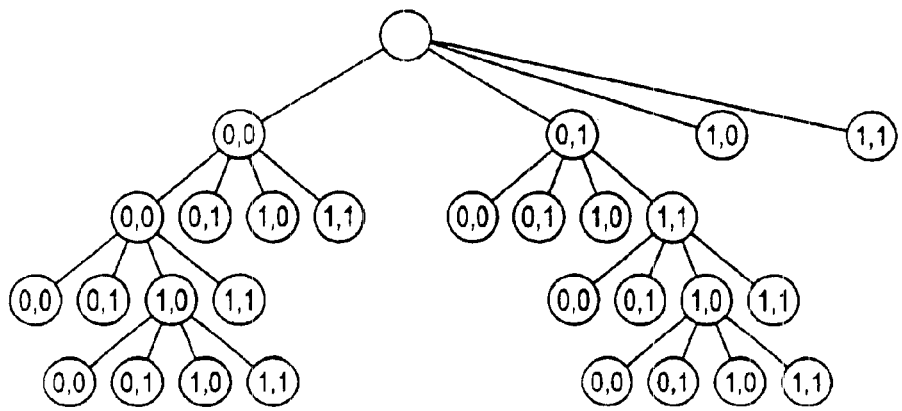
FIG. 13 depicts still another sorting example.
FIG. 14 illustrates an OctTree example.
FIG. 15 depicts a further sorting example.

In the example illustrated in FIG. 13, this would require checking all boxes whose indexes satisfy the following equation.

$0011,0001-1,1 \leq \bar{i} < 0111,0101+1,1 \Rightarrow 0010,0000 \leq \bar{i} < 1000,0110$ (25)

The sequence of boxes to be checked is generated. It is sufficient to traverse the tree, depth-first. For the particular example described above, the tree is shown in FIG. 14. The search starts browsing the leftmost branch of the tree until all leaves are traversed, and then continues exploring the second leftmost branch of the tree. The last two branches are discarded because their indexes are outside the allowed range, that is, the following conditions are not satisfied:

$0010,0000 \leq 1\text{xxx},0\text{xxxx} < 1000,0110$ and (26)

$0010,00 \leq 1\text{xxx},1\text{xxxx} < 1000,0110$ (00,10 (27)

A more efficient alternative is to only check the boxes that are in the close neighborhood of the edge, as shown in FIG. 15. The equation of the edge in Cartesian space, which is $P(a)=(x_0,y_0,z_0)+\alpha\cdot(\Delta x,\Delta y,\Delta z)$ with $\|\Delta x,\Delta y,\Delta z\|_2=1$
and $0 \leq \alpha \leq \alpha_{max}$ (28)

becomes the OctTree index space $$\bar{i}(a) = 2^n \cdot \left[ \left( \frac{x_0 - x_{min}}{x_{max} - x_{min}}, \frac{y_0 - y_{min}}{y_{max} - y_{min}}, \frac{z_0 - z_{min}}{z_{max} - z_{min}} \right) + \alpha \cdot \left( \frac{\Delta x}{z_{max} - z_{min}}, \frac{\Delta y}{z_{max} - z_{min}}, \frac{\Delta z}{z_{max} - z_{min}} \right) \right] \quad (29)$$

Using this equation, it is now possible to traverse the tree and for each box to determine if it contains a portion of the edge. Even if the technique requires additional computations to determine the list of boxes to be included in the search, it culls some of the boxes that would otherwise have been selected and as a consequence reduces the number of vertices whose di stance from the target needs to be evaluated. On average, the overall number of calculations is less than in the previous implementation. Since OctTree are three-dimensional binary trees, the searching algorithm in accordance with the present invention has logarithmic, base 2, complexity.

While the invention has been described in connection with one or more embodiments, it is to be understood that the specific mechanisms and techniques which have been described are merely illustrative of the principles of the invention. Numerous modifications may be made to the methods and apparatus described without departing from the spirit and scope of the invention as defined by the appended claims.

What is claimed is:

1. A computer-implemented method for reconstructing topological information for a mesh for use in interactive simulation with complex vehicle models, said mesh comprising a polygonal soup of triangles with sides and vertices, said method comprising the steps of:
   building vertex and edge connectivity data;
   finding duplicates of vertices;
   removing said duplicates of vertices;
   splitting at least one triangle into at least two new elements; and
   realigning strips of triangles without common vertices.

2. The method as set forth in claim 1 wherein said step of building vertex and edge connectivity data comprises the steps of:
   generating a representative index;
   creating a vertex-neighbor table; and
   rebuilding an edge-neighbor table.

3. The method as recited in claim 2 wherein said step of removing duplicate vertices comprises:
   searching for unconnected sides of triangles;
   searching for duplicates of the vertices at the ends of said unconnected sides;
   replacing all duplicate vertices with original vertices;
   adding triangles connected to the duplicate vertices to said original vertices; and
   rebuilding said edge-neighbor table for all triangles connected to said original vertices.

4. The method as set forth in claim 3 wherein said step of searching for duplicates comprises searching in said vertex-neighbor table for the closest vertex.

5. The method as set forth in claim 4 wherein said step of searching for the closest vertex comprises using an OctTree structure.

6. The method as set forth in claim 4 wherein said step of searching for the closest vertex comprises using a log2-complexity search method.

7. The method as set forth in claim 6 wherein said log2-complexity search method comprises using an OctTree structure.

8. A computer-implemented method for fixing holes in topological information for a mesh for use with interactive simulations, said mesh comprising a polygonal soup of triangles with sides and vertices, said method comprising the steps of:
   building vertex and edge connectivity data;
   finding duplicates of vertices;
   removing said duplicates of vertices;
   splitting at least one triangle into at least two new elements; and
   realigning strips of triangles without common vertices.

9. The method as set forth in claim 8 wherein said step of building vertex and edge connectivity data comprises the steps of:
   generating a representative index;
   creating a vertex-neighbor table; and
   building an edge-neighbor table.

10. The method as recited in claim 9 wherein said step of removing duplicate vertices comprises:
    searching for unconnected sides of triangles;
    searching for duplicates of the vertices at the ends of said unconnected sides;
    replacing all duplicate vertices with original vertices;
    adding triangles connected to the duplicate vertices to said original vertices; and
    rebuilding said edge-neighbor table for all triangles connected to said original vertices.

11. A computer-implemented method for fixing holes in topological information for a mesh for use with interactive simulations, said mesh comprising a polygonal soup of triangles with sides and vertices, said method comprising the steps of:
    (a) building vertex and edge connectivity data comprising:
        generating a representative index;
        creating a vertex-neighbor table; and
        building an edge-neighbor table;
    (b) finding duplicates of vertices;
    (c) removing said duplicates of vertices comprising:
        searching for unconnected sides of triangles;
        searching for duplicates of the vertices at the ends of said unconnected sides;
        replacing all duplicate vertices with original vertices;
        adding triangles connected to the duplicate vertices to said original vertices; and
        rebuilding said edge-neighbor table for all triangles connected said original vertices, and
    (d) realigning strips of triangles without common vertices.

* * * * *